(12) United States Patent
Sakai

(10) Patent No.: US 12,525,493 B2
(45) Date of Patent: Jan. 13, 2026

(54) SEMICONDUCTOR DEVICE

(71) Applicant: Mitsubishi Electric Corporation, Tokyo (JP)

(72) Inventor: Yasuhiro Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 363 days.

(21) Appl. No.: 18/005,037

(22) PCT Filed: Oct. 20, 2020

(86) PCT No.: PCT/JP2020/039388
§ 371 (c)(1),
(2) Date: Jan. 10, 2023

(87) PCT Pub. No.: WO2022/085068
PCT Pub. Date: Apr. 28, 2022

(65) Prior Publication Data
US 2023/0253274 A1  Aug. 10, 2023

(51) Int. Cl.
| | |
|---|---|
| *H01L 23/498* | (2006.01) |
| *H01L 23/04* | (2006.01) |
| *H01L 23/373* | (2006.01) |
| *H01L 23/49* | (2006.01) |
| *H01L 25/07* | (2006.01) |
| *H01L 25/18* | (2023.01) |

(52) U.S. Cl.
CPC .............. *H01L 23/04* (2013.01); *H01L 23/49* (2013.01); *H01L 23/49811* (2013.01); *H01L 23/3736* (2013.01)

(58) Field of Classification Search
CPC ... H01L 23/04; H01L 23/49; H01L 23/49811; H01L 23/3736; H01L 23/053;

(Continued)

(56) References Cited

U.S. PATENT DOCUMENTS

2014/0299982 A1* 10/2014 Minamio .............. H01L 25/162
257/786
2015/0380331 A1* 12/2015 Inaba ...................... H01L 25/18
257/693

(Continued)

FOREIGN PATENT DOCUMENTS

JP H10-242338 A 9/1998
JP H10-256319 A 9/1998

(Continued)

OTHER PUBLICATIONS

An Office Action; "Notice of Reasons for Refusal," mailed by the Japanese Patent Office on Oct. 3, 2023, which corresponds to Japanese Patent Application No. 2022-556851 and is related to U.S. Appl. No. 18/005,037; with English language translation.

(Continued)

*Primary Examiner* — Omar F Mojaddedi
(74) *Attorney, Agent, or Firm* — Studebaker Brackett PLLC

(57) ABSTRACT

Provided is a semiconductor device in which a bonding state between a bonding object and a terminal is improved. The semiconductor device includes a bonding object, a case, and a terminal. The bonding object includes a metal pattern. The case includes a frame body and accommodates the bonding object inside the frame body. The terminal includes a first end and a second end. The first end is bonded to the metal pattern of the bonding object. The second end is led out of the case from the first end. The bonding object is an insulating substrate or a semiconductor element held on an insulating substrate. The case includes a beam bridging across a space inside frame body. The beam holds a portion of the terminal between the first end and the second end.

8 Claims, 13 Drawing Sheets

(58) Field of Classification Search
CPC ..... H01L 23/3735; H01L 24/03; H01L 25/07; H01L 25/18
See application file for complete search history.

(56) References Cited

U.S. PATENT DOCUMENTS

| | | | | |
|---|---|---|---|---|
| 2018/0012833 | A1* | 1/2018 | Kato | H01L 23/057 |
| 2019/0103329 | A1* | 4/2019 | Aoki | H01L 23/055 |
| 2021/0111092 | A1* | 4/2021 | Wakiyama | H01L 23/367 |
| 2021/0384109 | A1* | 12/2021 | Tanimoto | H01L 23/16 |

FOREIGN PATENT DOCUMENTS

| | | |
|---|---|---|
| JP | 2009-200416 A | 9/2009 |
| JP | 2017-152525 A | 8/2017 |
| JP | 2018-006697 A | 1/2018 |
| JP | 2019-067885 A | 4/2019 |

OTHER PUBLICATIONS

International Search Report issued in PCT/JP2020/039388; mailed Jan. 19, 2021.
An Office Action mailed by the Chinese Patent Office on Oct. 14, 2024, which corresponds to Chinese Patent Application No. 202080106252.6 and is related to U.S. Appl. No. 18/005,037.
An Office Action mailed by China National Intellectual Property Administration on Mar. 13, 2025, which corresponds to Chinese Patent Application No. 202080106252.6 and is related to U.S. Appl. No. 18/005,037; with English language translation.
An Office Action mailed by China National Intellectual Property Administration on Jul. 1, 2025, which corresponds to Chinese Patent Application No. 202080106252.6 and is related to U.S. Appl. No. 18/005,037; with English Language translation.

* cited by examiner

F I G. 4
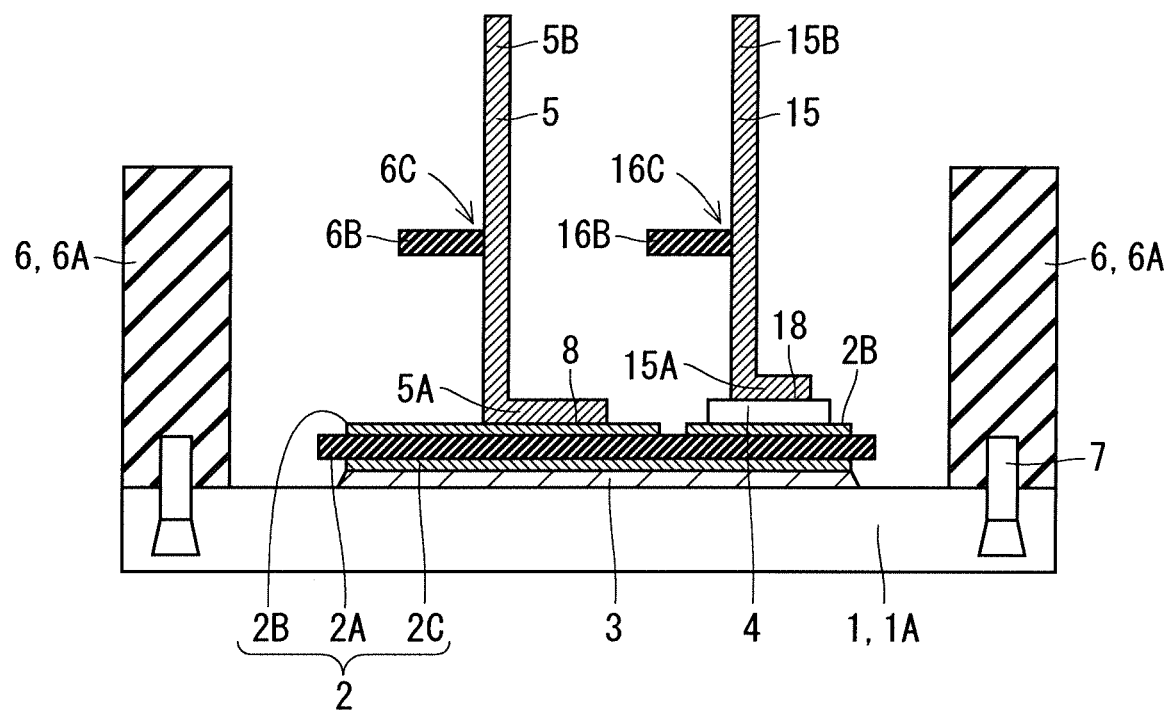

F I G. 6
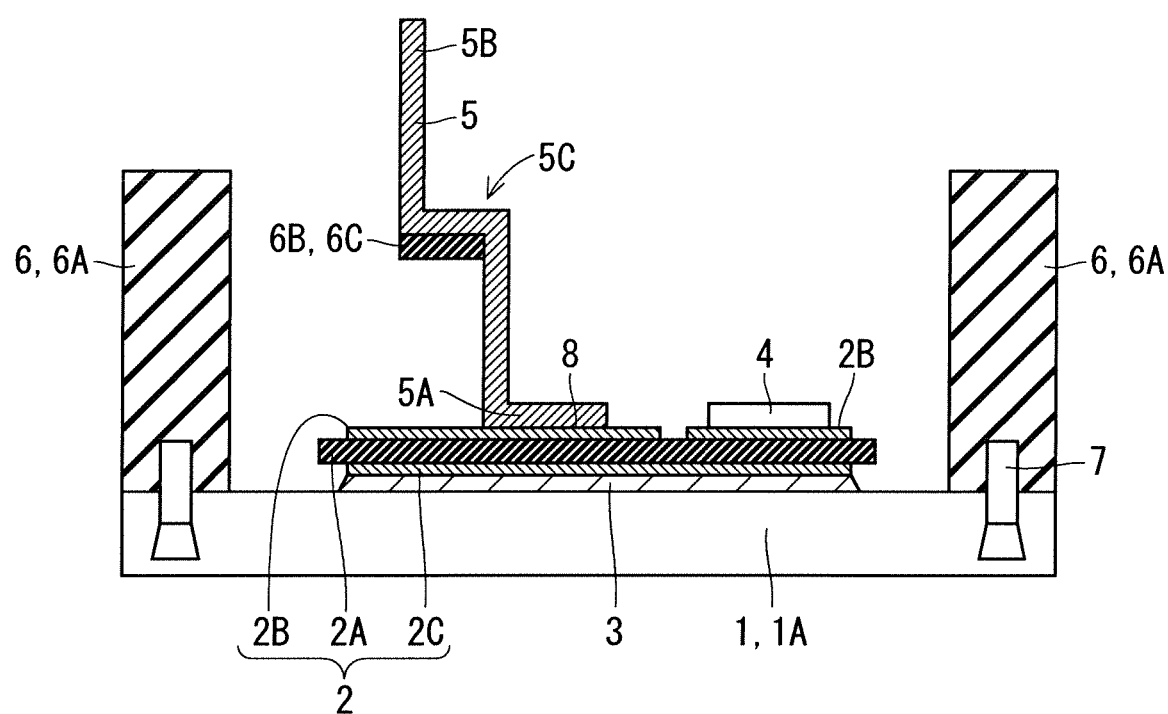

SEMICONDUCTOR DEVICE

TECHNICAL FIELD

The present disclosure relates to a semiconductor device.

BACKGROUND ART

A power semiconductor device includes an insulating substrate on which a semiconductor element and the like are held and a terminal that is connectable to an external circuit. Patent Document 1 discloses a semiconductor device in which a terminal is held by at least two terminal regulation portions protruding from the inner wall of a case.

PRIOR ART DOCUMENTS

Patent Document(s)

[Patent Document 1] Japanese Patent Application Laid-Open No. 2017-152525

SUMMARY

Problem to be Solved by the Invention

In order to improve the reliability of a semiconductor device, materializing a good bonding state at the bonding portion of each component is required.

In order to solve the above problem, the present disclosure provides a semiconductor device in which a good bonding state between a bonding object and a terminal is materialized.

Means to Solve the Problem

According to the present disclosure, the semiconductor device includes a bonding object, a case, and a terminal. The bonding object includes a metal pattern. The case includes a frame body and accommodates the bonding object inside the frame body. The terminal includes a first end and a second end. The first end is bonded to the metal pattern of the bonding object. The second end is led out of the case from the first end. The bonding object is an insulating substrate or a semiconductor element held on an insulating substrate. The case includes a beam bridging across a space inside frame body. The beam holds a portion of the terminal between the first end and the second end.

Effects of the Invention

According to the present disclosure, a semiconductor device is provided in which a good bonding state between a bonding object and a terminal is materialized.

The objects, features, aspects, and advantages of the present disclosure will become more apparent from the following detailed description and the accompanying drawings.

BRIEF DESCRIPTION OF DRAWINGS

FIG. 4 A cross-sectional view illustrating a configuration of a semiconductor device according to a modification example of the first embodiment.

FIG. 6 A cross-sectional view illustrating the configuration of the semiconductor device according to the second embodiment.

DESCRIPTION OF EMBODIMENT(S)

First Embodiment

Figure 1:
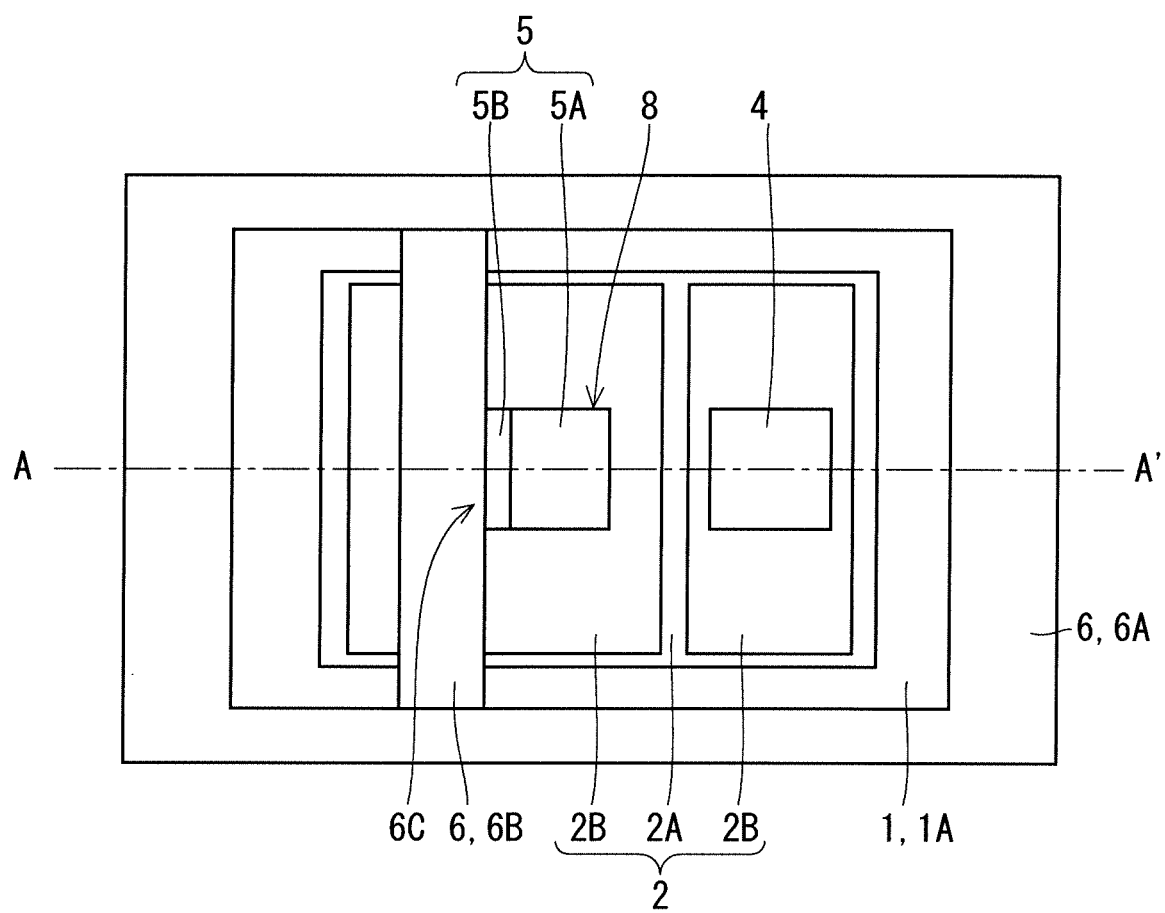
FIG. 1 A plan view illustrating a configuration of a semiconductor device according to a first embodiment.
Figure 2:
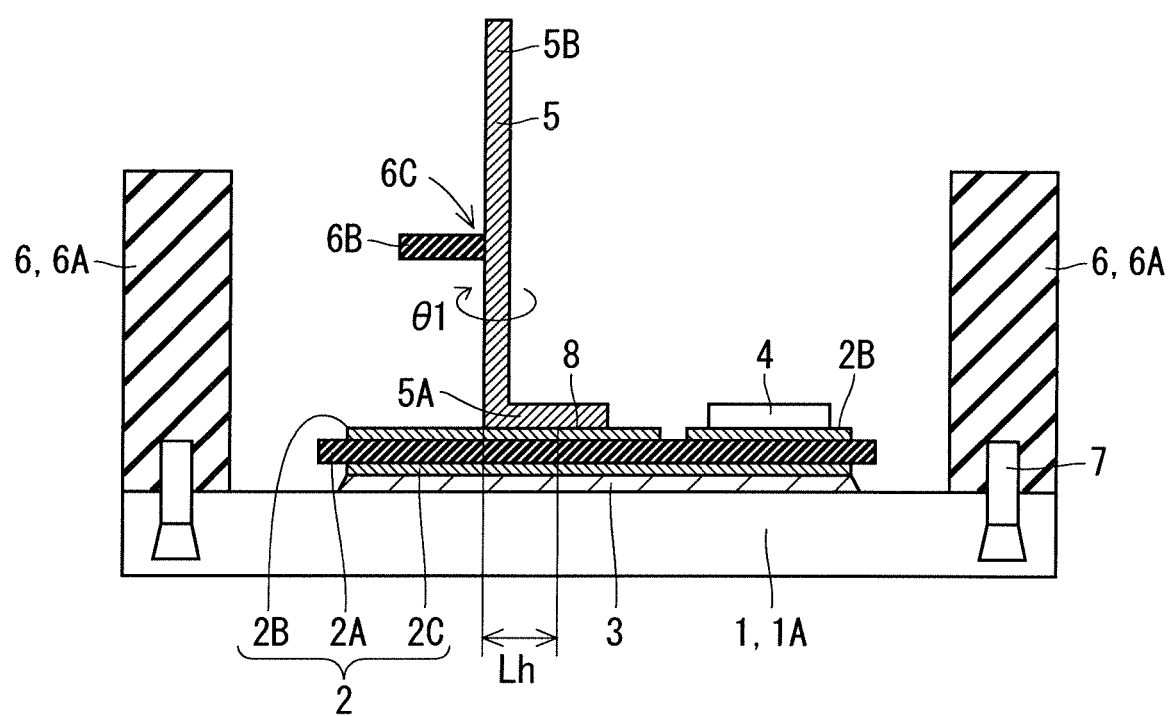
FIG. 2 A cross-sectional view illustrating the configuration of the semiconductor device according to the first embodiment.

FIG. 1 is a plan view illustrating a configuration of a semiconductor device according to a first embodiment. FIG. 2 is a cross-sectional view illustrating the configuration of the semiconductor device according to the first embodiment. FIG. 2 illustrates a cross section at A-A' illustrated in FIG. 1.

The semiconductor device includes a base plate 1, an insulating substrate 2, a semiconductor element 4, a terminal 5 and a case 6.

The base plate 1 is a metal plate composed of copper, aluminum, or the like, for example. The base plate 1 in the first embodiment is a heat radiation plate 1A and has a function of transferring heat generated by electronic components such as the semiconductor element 4 to the outside.

The insulating substrate 2 has a first metal pattern 2B on the upper surface of a substrate main body 2A and a second metal pattern 2C on the lower surface of the substrate main body 2A. The substrate main body 2A has insulating properties and is formed of ceramic, for example. The second metal pattern 2C is bonded to the heat radiation plate 1A. The second metal pattern 2C is bonded to the heat radiation plate 1A via a bonding material 3, which, being such as solder, a brazing material, a sintered material. Alternatively, the second metal pattern 2C may be bonded to the heat radiation plate 1A by pressure welding or the like. The insulating substrate 2 and the heat radiation plate 1A may be a single component, integrating both with each other. In that case, the insulating substrate is formed of an insulating layer on the heat radiation plate and metal patterns formed on the insulating layer. The insulating layer is formed of a resin, for example.

The semiconductor element 4 is bonded to the first metal pattern 2B of the insulating substrate 2 via a bonding material (not illustrated) such as solder. The semiconductor element 4 is formed of, for example, a semiconductor such as Si or a so-called wide bandgap semiconductor such as SiC or GaN. The semiconductor element 4 includes a power semiconductor element, a control integrated circuit (IC) for controlling the power semiconductor element, or the like. The semiconductor element 4 includes, for example, an Insulated Gate Bipolar Transistor (IGBT), a Metal Oxide Semiconductor Field Effect Transistor (MOSFET), a Schottky barrier diode or the like. Alternatively, the semiconductor element 4 may be a Reverse-Conducting IGBT (RC-IGBT) in which an IGBT and a free wheel diode are formed in a single semiconductor substrate.

The terminal 5 is a conductor configured to be connectable to an external circuit provided outside the semiconductor device. The terminal 5 has an elongated flat plate shape. The terminal 5 has a first end 5A and a second end 5B.

The first end 5A is bonded to the first metal pattern 2B of the insulating substrate 2, which is a bonding object. The first end 5A is in direct contact with the first metal pattern 2B.

The second end 5B is led out of the case 6 from the first end 5A and is connectable to an external circuit. Although not illustrated, the terminal 5 and an electrode pad of the semiconductor element 4 are electrically connected to each other via internal wiring including metal wires, the first metal pattern 2B of the insulating substrate 2, and the like, for example.

The case 6 includes a frame body 6A and a beam 6B. The frame body 6A and the beam 6B of the case 6 are made of resin, for example.

The case 6 accommodates the insulating substrate 2 and the semiconductor element 4 inside the frame body 6A. The frame body 6A is fixed to the heat radiation plate 1A with screws 7. Alternatively, the frame body 6A may be fixed to the heat radiation plate 1A by an adhesive, fitting, or the like.

The beam 6B is provided bridging across the space inside the frame body 6A. The beam 6B has a terminal holding portion 6C. The terminal holding portion 6C in the first embodiment is provided on the side surface of the beam 6B. The terminal holding portion 6C holds a portion of the terminal 5 located between the first end 5A and the second end 5B. For example, the terminal holding portion 6C clamps both side surfaces of a flat plate forming the terminal 5 (not illustrated). In the direction parallel to the insulating substrate 2 (horizontal direction), the distance between the terminal holding portion 6C and a bonding portion 8 is shorter than the distance between the frame body 6A and the bonding portion 8. In other words, the terminal 5 is held by the terminal holding portion 6C which is closer to the bonding portion 8 than the frame body 6A of the case 6 is.

Although not illustrated, the space inside the frame body 6A of the case 6 is to be filled with a sealing material. Further, a lid is provided above the sealing material.

Next, a method of manufacturing the semiconductor device according to the first embodiment will be described.

The heat radiation plate 1A, the insulating substrate 2 and the case 6 are prepared. The insulating substrate 2 is bonded onto the heat radiation plate 1A and the case 6 is fixed to the heat radiation plate 1A. The case 6 is provided with the beam 6B that bridges across the space inside the frame body 6A.

The terminal 5 is placed on the first metal pattern 2B of the insulating substrate 2. The terminal 5 is placed such that a portion of the terminal 5 between the first end 5A and the second end 5B is held by the terminal holding portion 6C of the beam 6B, and the first end 5A is in direct connect with the first metal pattern 2B of the insulating substrate 2. The terminal holding portion 6C restricts movement of the terminal 5 so that the terminal 5 cannot move or rotate in the horizontal direction.

Figure 3:
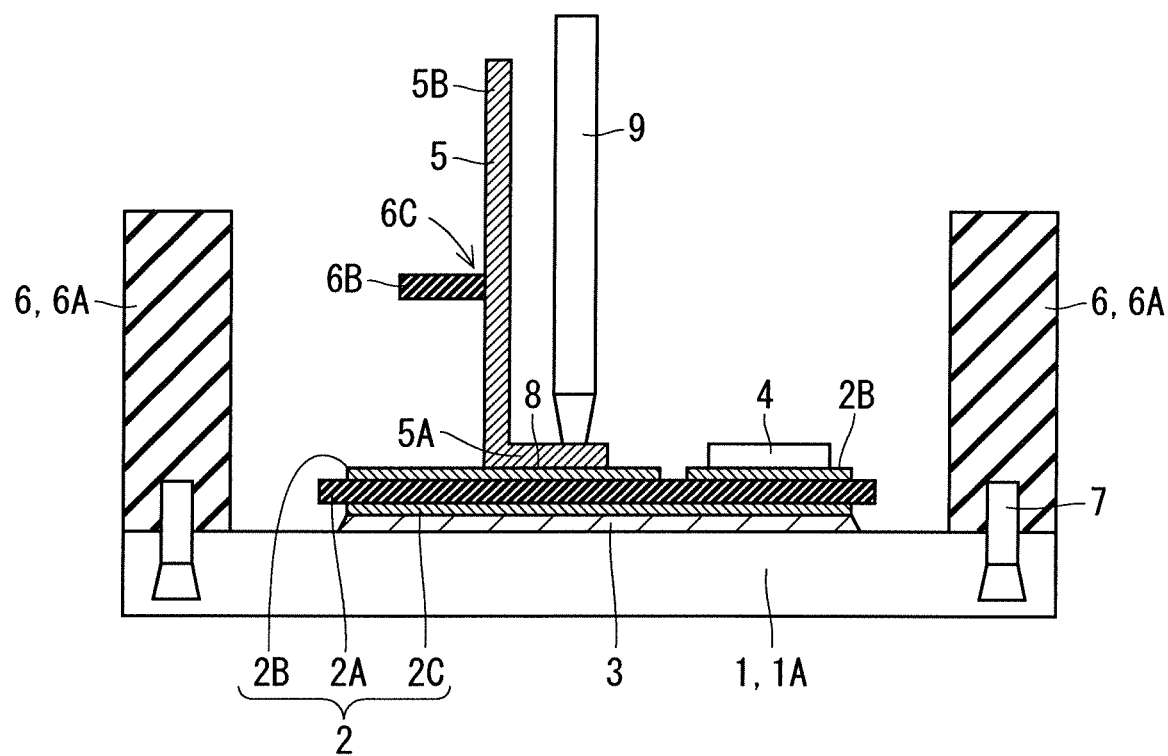
FIG. 3 A diagram illustrating an example of a step of bonding a terminal and a first metal pattern.

The terminal 5 is ultrasonically bonded to the first metal pattern 2B of the insulating substrate 2. FIG. 3 is a diagram illustrating an example of a step of bonding the terminal 5 and the first metal pattern 2B. While applying a load to the first end 5A and the first metal pattern 2B from above the first end 5A, an ultrasonic bonding tool 9 further applies ultrasonic vibrations. As a result, the bonding portion 8 is formed where the terminal 5 and the first metal pattern 2B are bonded to each other. Although not illustrated, the terminal 5 and the semiconductor element 4 are connected with metal wires. The space inside the case 6 is filled with the sealing material. Further, a lid is provided above the sealing material.

Although the example in which one beam 6B is provided inside the frame body 6A has been illustrated in the first embodiment, the configuration of the case 6 is not limited thereto. A plurality of beams may also bridge across inside the frame body 6A. The plurality of beams may also be arranged in a grid pattern in plan view. Also, a plurality of terminals may also be held by one beam.

In summary, the semiconductor device according to the first embodiment includes the insulating substrate 2, the case 6 and the terminal 5. The insulating substrate 2 includes the first metal pattern 2B. The case 6 includes the frame body 6A and accommodates the insulating substrate 2 inside the frame body 6A. The terminal 5 has the first end 5A and the second end 5B. The first end 5A is bonded to the first metal pattern 2B of the insulating substrate 2. The second end 5B is led out of the case 6 from the first end 5A. The case 6 includes the beam 6B bridging across the space inside frame body 6A. The beam 6B holds a portion of the terminal 5 between the first end 5A and the second end 5B.

The terminal 5 is bonded to the first metal pattern 2B of the insulating substrate 2 in the method of manufacturing the semiconductor device. At this point, the longer the horizontal distance (Lh) between the terminal holding portion 6C and the position to be bonded, the more likely the terminal 5 is rotated (θ1) about the vertical direction of the terminal 5. Therefore, when the distance (Lh) is long, the positional deviation (Lh×θ1) of the bonding portion 8 becomes large. That is, the first end 5A is bonded at a position deviated with respect to the position to be bonded. Meanwhile, in the first embodiment, the beam 6B holds the terminal 5 at a position which is closer to the position to be bonded than the frame body 6A is. The distance (Lh) is short; therefore, the rotation (θ1) is less likely to occur. Also, the beam 6B remains to hold the terminal 5 during the bonding process; therefore, the positional deviation (Lh×θ1) of the bonding portion 8 is reduced. As a result, a good bonding state between the first metal pattern 2B and the terminal 5 is materialized. Further, when the terminal 5 is bonded to the insulating substrate 2 with the terminal 5 being held by a dedicated jig, a process to remove the jig after bonding is required. No such process is required in the method of manufacturing the semiconductor device according to the first embodiment, improving the production efficiency. Further, when the terminal 5, embedded and integrated in the case 6, is bonded to the insulating substrate 2, foreign matter such as metal may be mixed into the inside of the case 6 in some cases. No such mixing of foreign matter occurs in the method of manufacturing according to the first embodiment, improving the insulation properties. The structure in which the terminal 5 is held by the beam 6B is suitable for a power semiconductor device having a breakdown voltage of 1.7 kV or more.

Modification Example of First Embodiment

FIG. 4 is a cross-sectional view illustrating a configuration of a semiconductor device according to a modification example of the first embodiment. A first end 15A of a terminal 15 is bonded to an electrode pad (not illustrated) of the semiconductor element 4. That is, the bonding object is the semiconductor element 4, and the metal pattern is the electrode pad. A second end 15B of the terminal 15 is led out of the case 6 from the first end 15A. A beam 16B has a terminal holding portion 16C. The terminal holding portion 16C holds a portion of the terminal 15 located between the first end 15A and the second end 15B. In the horizontal direction, the distance between the terminal holding portion 16C and a bonding portion 18 is shorter than the distance between the frame body 6A and the bonding portion 18. In other words, the terminal 15 is held by the terminal holding portion 16C which is closer to the bonding portion 18 than the frame body 6A of the case 6 is. Such a structure has the same effect as that of the first embodiment.

Second Embodiment

A method of manufacturing the semiconductor device according to a second embodiment will be described. The second embodiment is a subordinate concept of the first embodiment. In the second embodiment, the same reference numerals are given to the same components as in the first embodiment, and detailed description thereof will be omitted.

Figure 5:
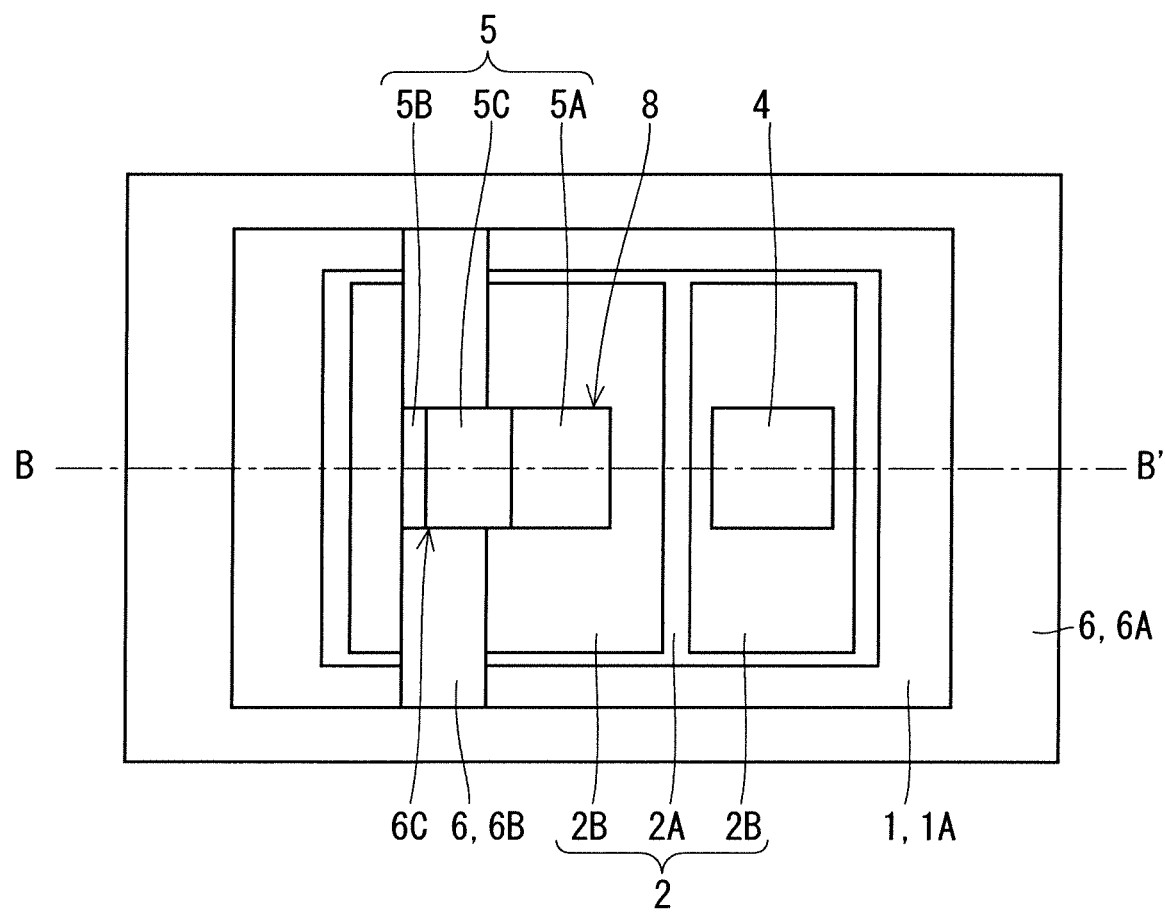
FIG. 5 A plan view illustrating a configuration of a semiconductor device according to a second embodiment.

FIG. 5 is a plan view illustrating a configuration of the semiconductor device according to the second embodiment. FIG. 6 is a cross-sectional view illustrating the configuration of the semiconductor device according to the second embodiment. FIG. 6 illustrates a cross section at B-B' illustrated in FIG. 5.

The terminal 5 has two bent portions above the bonding portion 8. As illustrated in FIG. 6, the terminal 5 is bent in the horizontal direction in the middle of the terminal 5 extending from the bonding portion 8 upward. The terminal 5 is bent further upward from the horizontal direction. A flat portion is formed between the two bent portions. The terminal 5 has a held portion 5C provided on the flat portion thereof. The held portion 5C is in contact with the upper surface of the beam 6B.

The terminal holding portion 6C of the beam 6B corresponds to the upper surface of the beam 6B. The terminal holding portion 6C holds the held portion 5C of the terminal 5 on the upper surface of the beam 6B. Moreover, the terminal holding portion 6C may include a side surface of the beam 6B, and the side surface of the beam 6B may be in contact with the main surface (wide surface) of the terminal 5.

Figure 7:
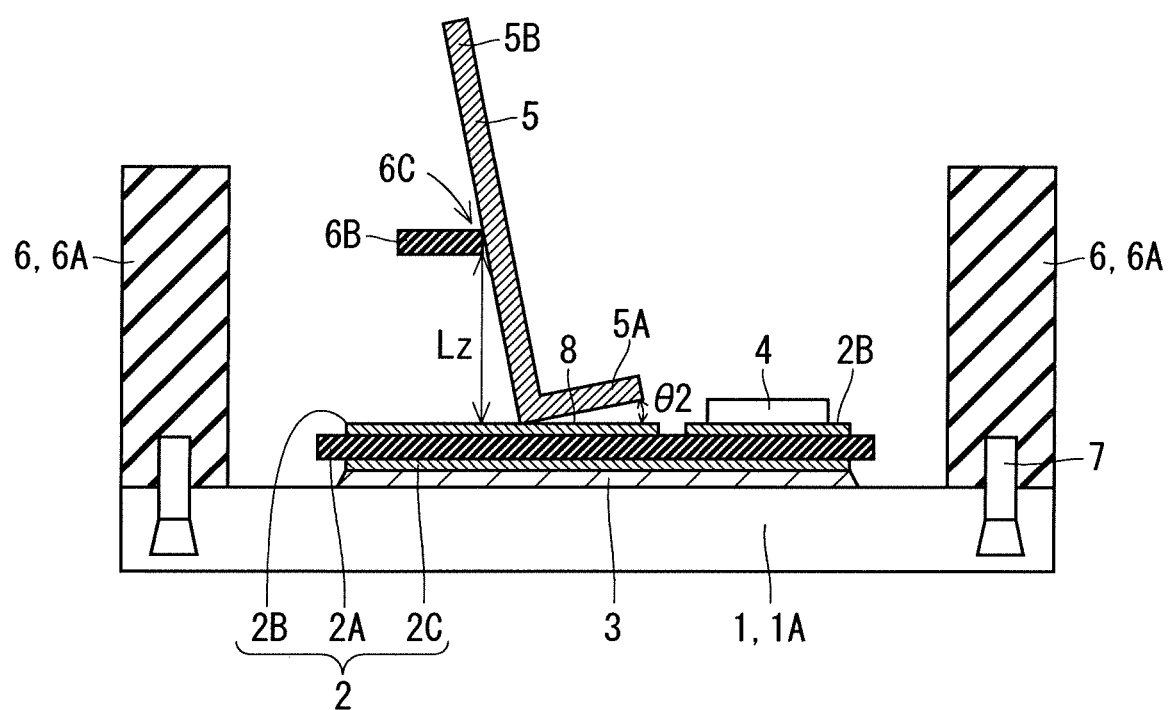
FIG. 7 A diagram illustrating an example of a state of a terminal, without two bent portions, being tilted.

FIG. 7 is a diagram illustrating an example of a state of the terminal 5, without two bent portions, being tilted. In FIG. 7, the terminal 5 rotates in a plane perpendicular to the insulating substrate 2 with the corner of the first end 5A of the terminal 5 as a fulcrum. The longer the distance (Lz) in the vertical direction (gravity direction) between the terminal holding portion 6C and the position to be bonded, the more likely the terminal 5 is rotated ($\theta 2$). Therefore, when the distance (Lz) is long, the positional deviation (Lz×$\theta 2$) of the bonding portion 8 becomes large. That is, the first end 5A is bonded at a position deviated with respect to the position to be bonded. In the second embodiment, as illustrated in FIG. 6, the held portion 5C of the terminal 5 is held by the terminal holding portion 6C of the beam 6B. Therefore, the rotation ($\theta 2$) of terminal 5 is prevented. The positional deviation (Lz×$\theta 2$) of the bonding portion 8 is reduced, and the bonding state is improved. Further, when the side surface of the beam 6B forming the terminal holding portion 6C is in contact with the main surface of the terminal 5, the rotation ($\theta 1$) of the terminal 5 is prevented as illustrated in FIG. 2. Accordingly, positional deviation (Lh×$\theta 1$) of the bonding portion 8 is reduced. As a result, a good bonding state between the first metal pattern 2B and the terminal 5 is materialized.

Third Embodiment

A semiconductor device according to a third embodiment will be described. The third embodiment is a subordinate concept of the first embodiment. In the third embodiment, the same reference numerals are given to the same components as in the first or second embodiment, and detailed description thereof will be omitted.

Figure 8:
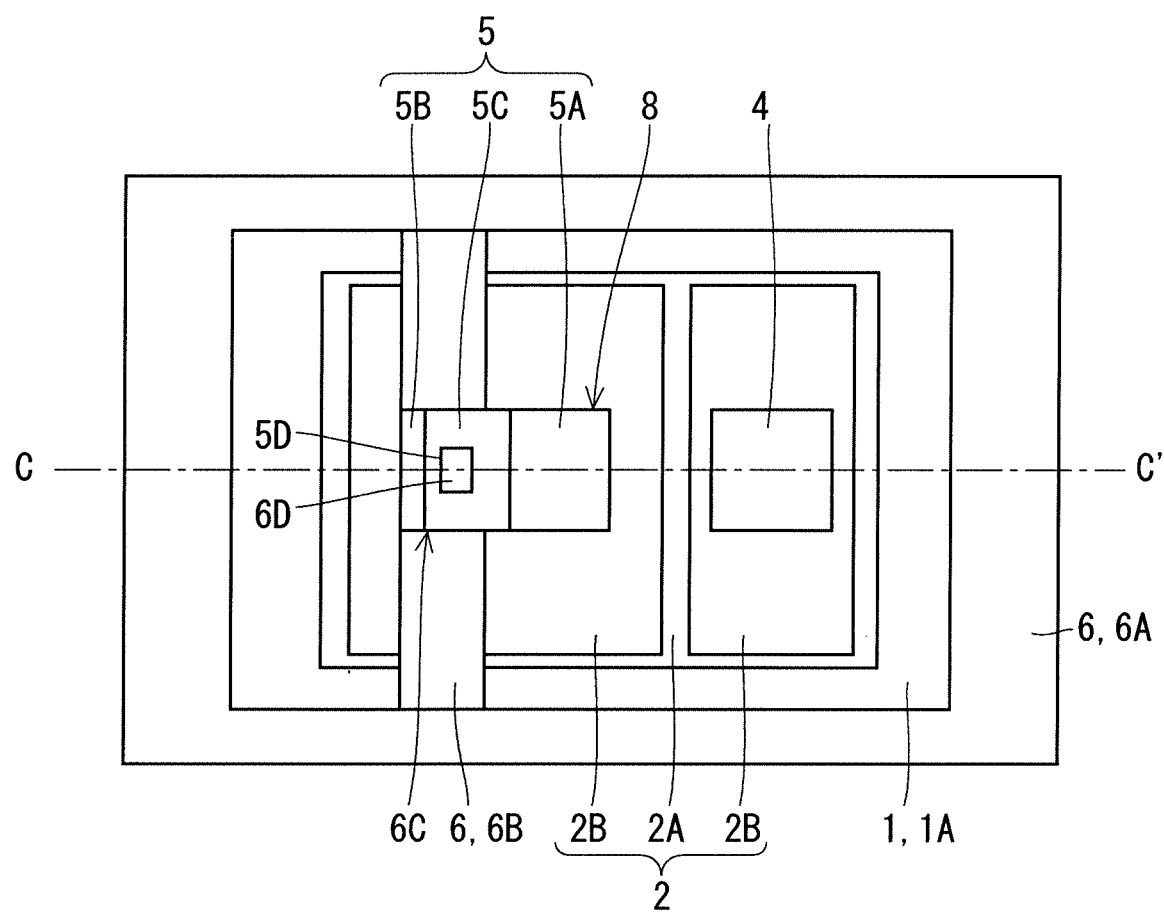
FIG. 8 A plan view illustrating a configuration of a semiconductor device according to a third embodiment.
Figure 9:
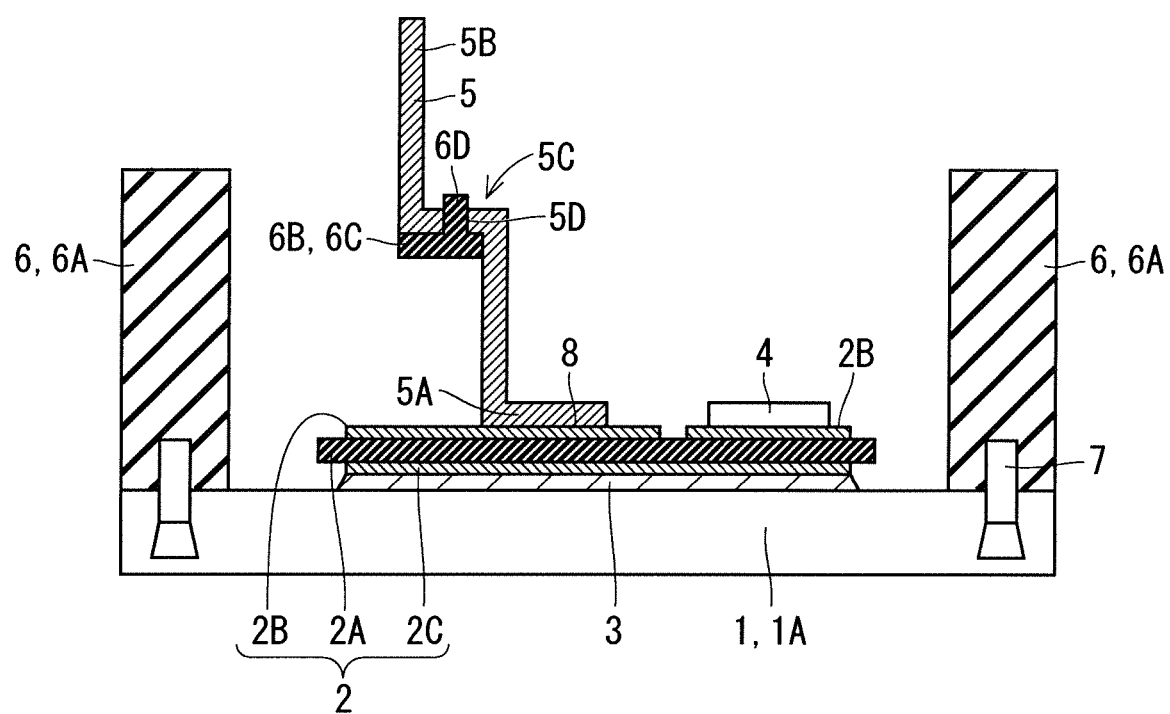
FIG. 9 A cross-sectional view illustrating the configuration of the semiconductor device according to the third embodiment.

FIG. 8 is a plan view illustrating a configuration of the semiconductor device according to the third embodiment. FIG. 9 is a cross-sectional view illustrating the configuration of the semiconductor device according to the third embodiment. FIG. 9 illustrates a cross section at C-C' illustrated in FIG. 8.

The terminal 5 has a first through hole 5D in the flat portion between the two bent portions. The first through hole 5D extends through the upper surface and the lower surface of the flat portion. A held portion 5C in the third embodiment has the first through hole 5D.

The beam 6B has a first projection 6D on the upper surface of the beam 6B. The first projection 6D is provided so as to fit into the first through hole 5D of the terminal 5. The terminal holding portion 6C in the third embodiment has a portion of the upper surface of the beam 6B and the first projection 6D. The beam 6B holds the terminal 5 by the first projection 6D fitting into the first through hole 5D.

The planar shape of the first through hole 5D and the first projection 6D includes a circle, an ellipse, a polygon, or the like. Instead of the first through hole 5D, a first cavity into which the first projection 6D fits may be provided on the lower surface of the flat portion.

With such a configuration, the arrangement of the beam 6B, the terminal 5 and the insulating substrate 2 is defined. And the good bonding state at the bonding portion 8 is materialized.

Fourth Embodiment

A semiconductor device according to a fourth embodiment will be described. The fourth embodiment is a subordinate concept of the first embodiment. In the fourth embodiment, the same reference numerals are given to the same components as in the first to third embodiments, and detailed description thereof will be omitted.

Figure 10:
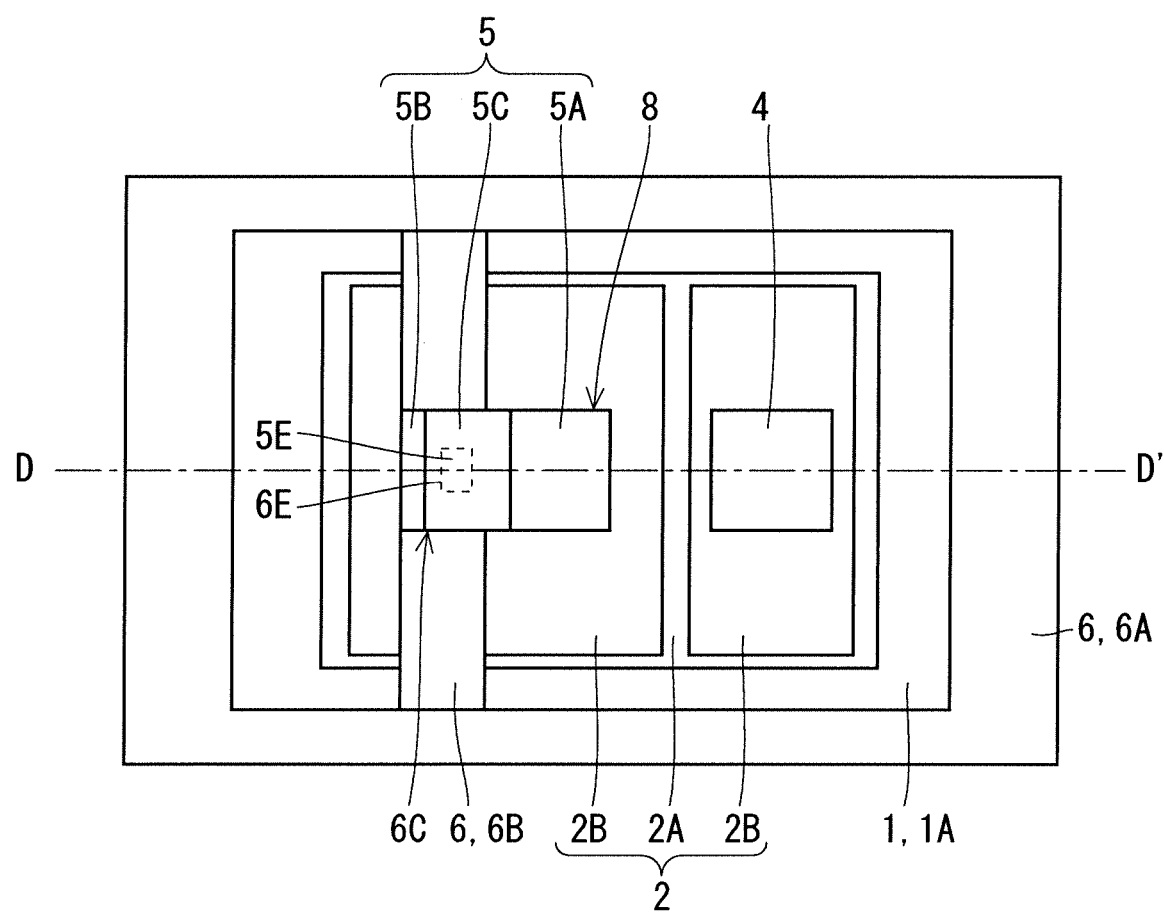
FIG. 10 A plan view illustrating a configuration of a semiconductor device according to a fourth embodiment.
Figure 11:
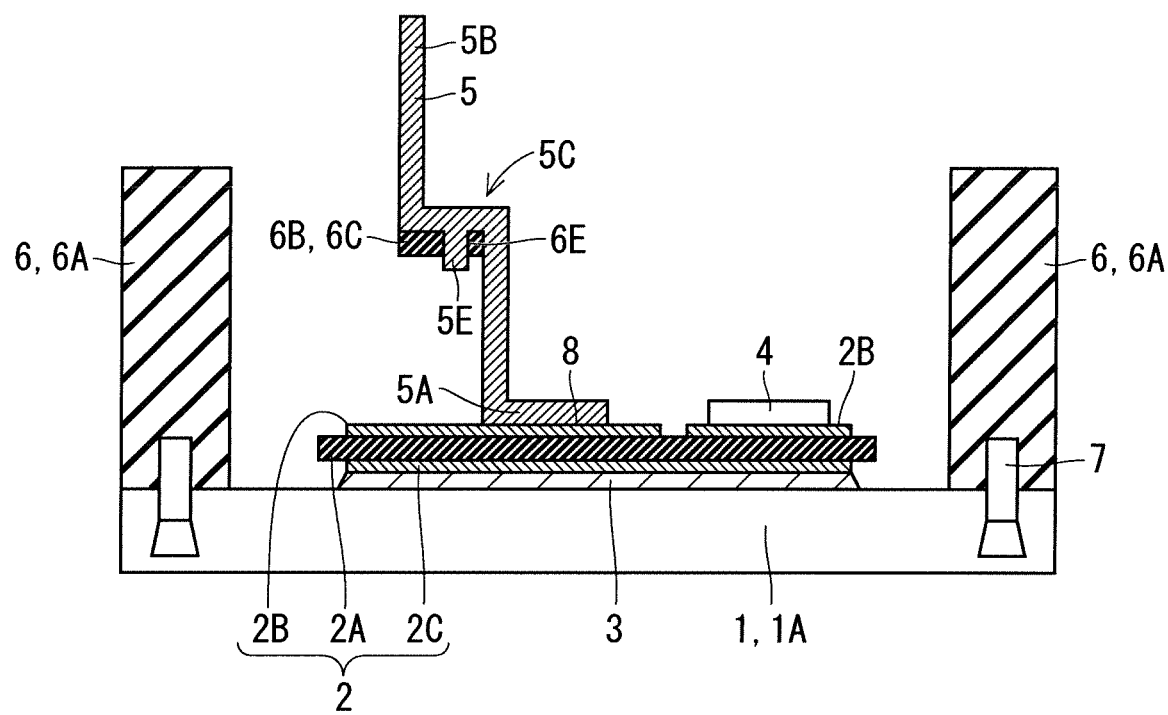
FIG. 11 A cross-sectional view illustrating the configuration of the semiconductor device according to the fourth embodiment.

FIG. 10 is a plan view illustrating a configuration of the semiconductor device according to the fourth embodiment. FIG. 11 is a cross-sectional view illustrating the configuration of the semiconductor device according to the fourth embodiment. FIG. 11 illustrates a cross section at D-D' illustrated in FIG. 10.

The terminal 5 has a second projection 5E in the lower surface of the flat portion between the two bent portions. The held portion 5C in the fourth embodiment has the second projection 5E.

The beam 6B has a second through hole 6E. The second through hole 6E extends through the upper surface and the lower surface of the beam 6B. The second through hole 6E is provided so as to fit into the second projection 5E of the terminal 5. The terminal holding portion 6C in the fourth embodiment has a portion of the upper surface of the beam 6B and the second through hole 6E. The beam 6B holds the terminal 5 by the second projection 5E fitting into the second through hole 6E.

The planar shape of the second projection 5E and the second through hole 6E includes a circle, an ellipse, a polygon, or the like. Instead of the second through hole 6E, a second cavity into which the second projection 5E fits may be provided on the upper surface of the beam 6B.

With such a configuration, the arrangement of the beam 6B, the terminal 5 and the insulating substrate 2 is defined. And the good bonding state at the bonding portion 8 is materialized.

Fifth Embodiment

A semiconductor device according to a fifth embodiment will be described. The fifth embodiment is a subordinate concept of the first embodiment. In the fifth embodiment, the same reference numerals are given to the same components as in the first to fourth embodiments, and detailed description thereof will be omitted.

Figure 12:
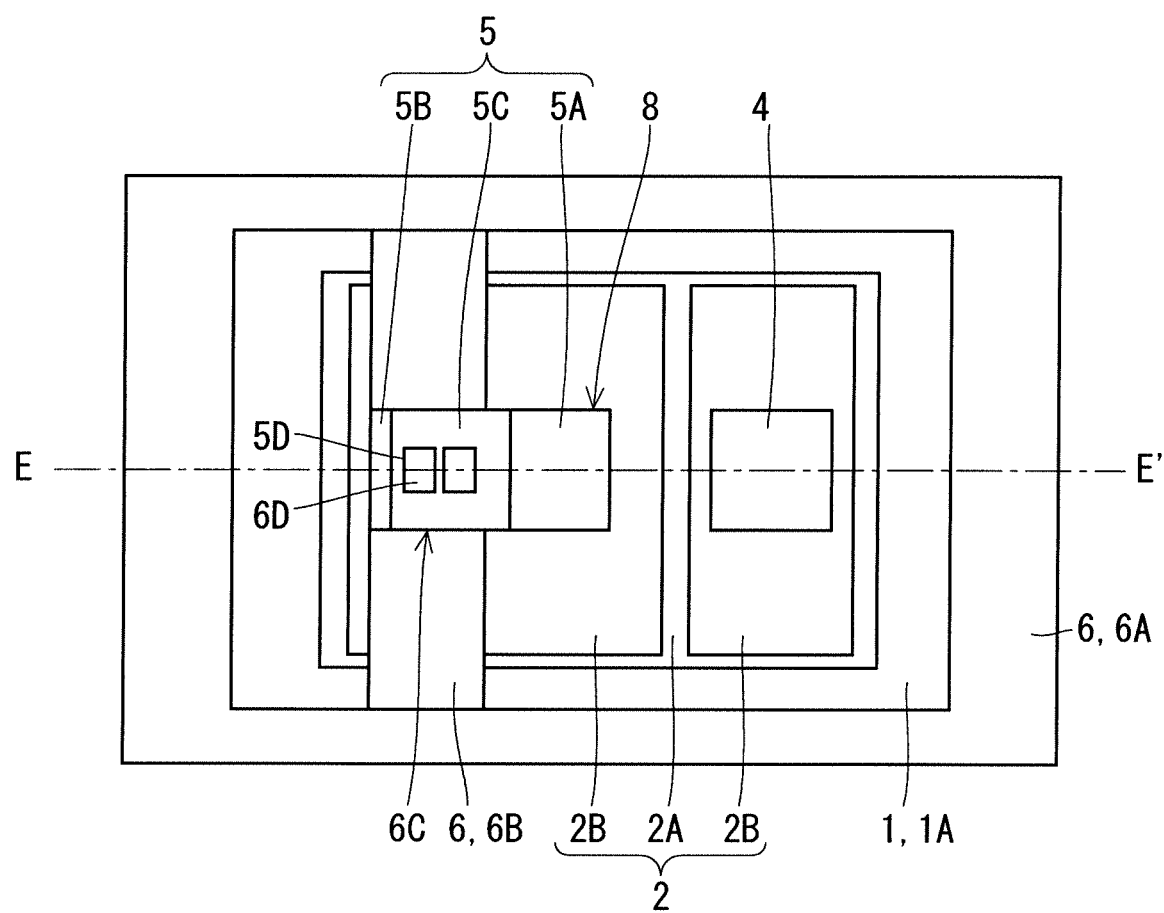
FIG. 12 A plan view illustrating a configuration of a semiconductor device according to the fifth embodiment.
Figure 13:
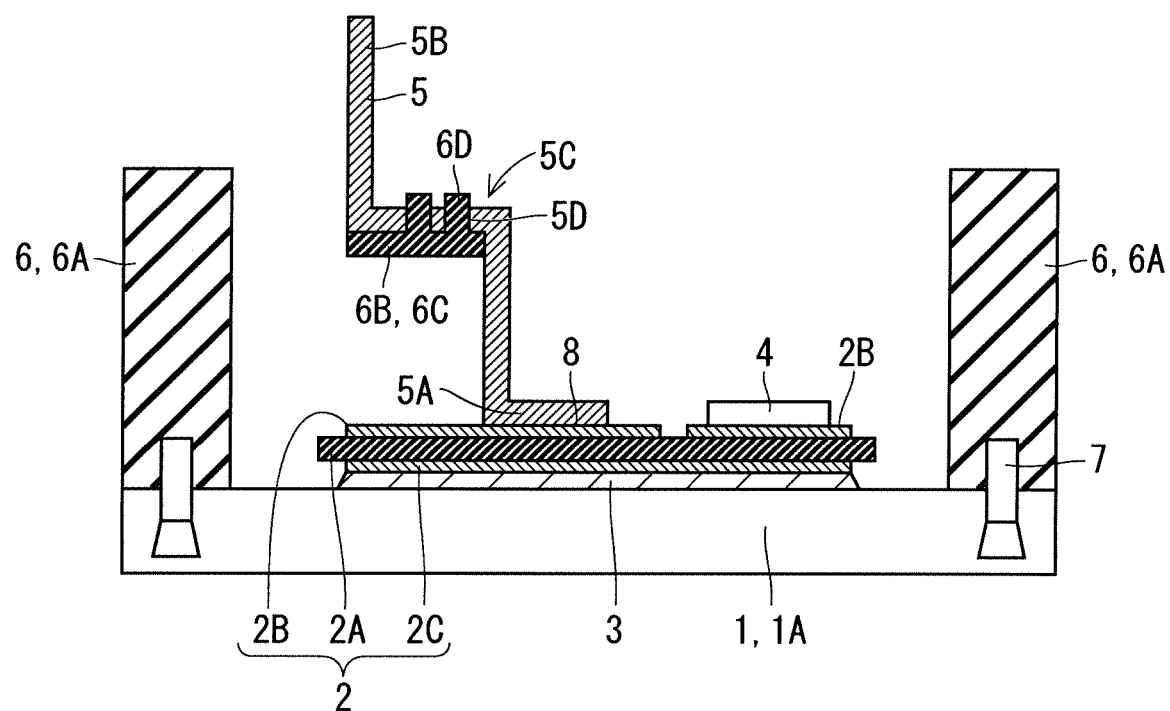
FIG. 13 A cross-sectional view illustrating the configuration of the semiconductor device according to the fifth embodiment.

FIG. 12 is a plan view illustrating a configuration of the semiconductor device according to the fifth embodiment. FIG. 13 is a cross-sectional view illustrating the configuration of the semiconductor device according to the fifth embodiment. FIG. 13 illustrates a cross section at E-E' illustrated in FIG. 12.

The terminal 5 has a plurality of first through holes 5D as the held portions 5C. The beam 6B has a plurality of first projections 6D as the terminal holding portion 6C. In the fifth embodiment, two first through holes 5D and two first projections 6D are provided, respectively. The beam 6B holds the terminal 5 by each first projection 6D fitting into each first through hole 5D. With such a configuration, the arrangement of the beam 6B, the terminal 5 and the insulating substrate 2 is defined. Also, the terminal 5 is firmly held by the plurality of first projections 6D and the plurality of first through holes 5D. And the good bonding state at the bonding portion 8 is materialized.

Modification Example of Fifth Embodiment

Although not illustrated, the terminal 5 may be provided with a plurality of second projections 5E as the held portion 5C. The beam 6B may be provided with a plurality of second through holes 6E as the terminal holding portion 6C. The beam 6B holds the terminal 5 by each second through hole 6E fitting each second projection 5E. With such a configuration, the same effect as described above is obtained.

In the present disclosure, the embodiments can be combined, appropriately modified or omitted, without departing from the scope of the invention.

EXPLANATION OF REFERENCE SIGNS

1 base plate, 1A heat radiation plate, 2 insulating substrate, 2A substrate body, 2B first metal pattern, 2C second metal pattern, 3 bonding material, 4 semiconductor element, 5 terminal, 5A first end, 5B second end, 5C held portion, 5D first through hole, 5E second projection, 6 case, 6A frame body, 6B beam, 6C terminal holding portion, 6D first projection, 6E second through hole, 7 screw, 8 bonding portion, 9 ultrasonic bonding tool.

The invention claimed is:

1. A semiconductor device comprising:
    a bonding object including a metal pattern;
    a case including a frame body and accommodating the bonding object inside the frame body; and
    a terminal having a first end bonded to the metal pattern of the bonding object and a second end led out of the case from the first end, wherein
    the bonding object is an insulating substrate or a semiconductor element held on an insulating substrate,
    the case includes a beam bridging across a space inside the frame body, and
    the beam holds a portion of the terminal between the first end and the second end, wherein a side surface of the beam is in contact with the portion of the terminal such that the portion of the terminal contacting the side surface of the beam is entirely outside of the beam.

2. The semiconductor device according to claim 1, wherein
    the terminal has a held portion provided at the portion of the terminal and is in contact with an upper surface of the beam, and
    the beam holds the held portion of the terminal on the upper surface of the beam.

3. The semiconductor device according to claim 1, wherein
    the terminal has at least one first cavity at the portion of the terminal,
    the beam has at least one first projection, and
    the at least one first cavity of the terminal fits into the at least one first projection of the beam.

4. The semiconductor device according to claim 3, wherein
    the at least one first cavity is at least one first through hole.

5. The semiconductor device according to claim 3, wherein
    the at least one first cavity is a plurality of first cavities, and
    the at least one first projection is a plurality of first projections.

6. The semiconductor device according to claim 1, wherein
    the terminal has at least one second projection at the portion of the terminal,
    the beam has at least one second cavity, and
    the at least one second projection of the terminal fits into the at least one second cavity of the beam.

7. The semiconductor device according to claim 6, wherein
    the at least one second cavity is at least one second through hole.

8. The semiconductor device according to claim 6, wherein
    the at least one second projection is a plurality of second projections, and
    the at least one second cavity is a plurality of second cavities.

* * * * *